(12) United States Patent
Dörfel et al.

(10) Patent No.: US 8,543,369 B2
(45) Date of Patent: Sep. 24, 2013

(54) METHOD AND DATA PROCESSING SYSTEM FOR SIMULATING AN EMBEDDED SYSTEM

(75) Inventors: Matthias Dörfel, Emmering (DE); Ralf Münzenberger, Erlangen (DE)

(73) Assignee: Inchron, GmbH, Potsdam (DE)

( * ) Notice: Subject to any disclaimer, the term of this patent is extended or adjusted under 35 U.S.C. 154(b) by 0 days.

(21) Appl. No.: 13/125,967

(22) PCT Filed: Dec. 23, 2009

(86) PCT No.: PCT/EP2009/067871
§ 371 (c)(1),
(2), (4) Date: Oct. 4, 2011

(87) PCT Pub. No.: WO2011/076278
PCT Pub. Date: Jun. 30, 2011

(65) Prior Publication Data
US 2012/0029899 A1    Feb. 2, 2012

(51) Int. Cl.
*G06F 9/44* (2006.01)
*G06F 13/10* (2006.01)
*G06F 13/12* (2006.01)
*G06F 17/50* (2006.01)

(52) U.S. Cl.
CPC .................................. *G06F 17/5022* (2013.01)
USPC ............................................. 703/21; 703/13

(58) Field of Classification Search
USPC ................................. 703/21–22, 13
See application file for complete search history.

(56) References Cited

U.S. PATENT DOCUMENTS

| 6,230,114 | B1 | 5/2001 | Hellestrand et al. |
| 7,155,690 | B2 * | 12/2006 | Yamashita et al. ............. 716/106 |
| 7,308,396 | B2 * | 12/2007 | Finch .............................. 703/21 |
| 2008/0228461 | A1 | 9/2008 | Calvez |

FOREIGN PATENT DOCUMENTS

| CN | 101 013 384 A | 8/2007 |
| JP | 03/244068 A | 10/1991 |
| JP | 09/006646 A | 1/1997 |
| JP | 2004/512591 A | 4/2004 |

(Continued)

OTHER PUBLICATIONS

Zong. "Nanoprocessors: Configurable Hardware Accelerators for Embedded System"., 2003. 143 Pages.*

(Continued)

*Primary Examiner* — Eunhee Kim
(74) *Attorney, Agent, or Firm* — Kilpatrick Townsend & Stockton LLP

(57) ABSTRACT

The invention relates to a computer-assisted method and data processing system for simulating an embedded system, wherein a plurality of hardware components, respectively provided with a software, are connected via a data exchange network for data exchange, wherein in a simulation program every component is simulated as a processing unit managing an amount of processes, wherein with the simulation program, a start time is dynamically assigned to every processing unit, wherein the processing units are successively sorted dynamically according to their start times, wherein the processing unit with the next start time is respectively selected via a scheduler, wherein, due to the selection of a processing unit, the respective active process is simulated by execution of a program code derived from a corresponding basic block graph and as a result of the simulation, the time required for the execution and/or information about the effected function is/are determined.

21 Claims, 4 Drawing Sheets

(56) References Cited

FOREIGN PATENT DOCUMENTS

Figure 1:
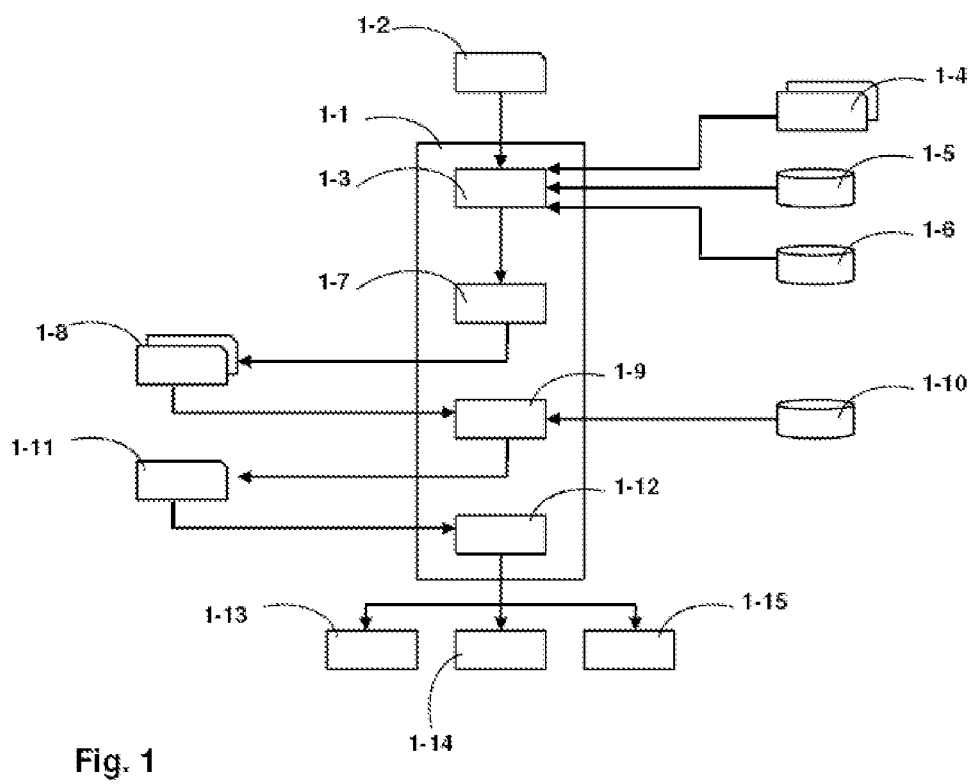

| | | |
|---|---|---|
| JP | 2008/059192 A | 3/2008 |
| WO | WO01/35223 A1 | 5/2001 |
| WO | WO02/21261 A2 | 3/2002 |
| WO | WO02/33538 A | 4/2002 |

OTHER PUBLICATIONS

Bammi, Jwahar R., et al., "Software Performance Estimation Strategies in a System-Level Design Tool", Proceedings of the 8$^{th}$ International Workshop on Hardware/ Software Codesigns Codes 2000, San Dieego CA, May 3-5, 2000, 82-86.

Chung, Moo-Kong et al., "Improvement of Compiled Instruction Set Simulator by Increasing Flexibility and Reducing Compile Time", Proceedings of the 15$^{th}$ IEEE International Workshop on Rapid System Prototyping, 2004, 1074-6005.

International Preliminary Report on Patentability and Written Opinion dated Jul. 10, 2012 for International Application No. PCT/EP2009/067871, 7 pages.

International Search Report dated Nov. 9, 2010 for International Application No. PCT/EP2009/067871, 3 pages.

Shimazu Nobuyuki et al. "A Study on Parallel Discrete Event Simulation based on the Virtual Time Algorithm", Technical Report of IEICE, Japan, The Institute of Electronics, Information and Communication Engineers, Aug. 23, 1995, 95(210): 33-38 (English Abstract).

Zhu, Jianwen et al., "An Ultra-Fast Instruction Set Simulator", IEEE Transactions on very large scale Integration (VLSI) Systems, Jun. 2002, 1063-8210, 10(3):363-373.

\* cited by examiner

METHOD AND DATA PROCESSING SYSTEM FOR SIMULATING AN EMBEDDED SYSTEM

CROSS-REFERENCE TO RELATED APPLICATION

This present application claims priority to PCT/EP2009/067871 filed Dec. 23, 2009, and entitled "METHOD AND DATA PROCESSING SYSTEM FOR SIMULATING AN EMBEDDED SYSTEM", which is hereby incorporated by reference in its entirety.

The invention relates to a computer-assisted or computer-implemented method and data processing system for simulating an embedded system, in particular for computer-assisted simulation of an embedded system.

An embedded system is a computer which is integrated or embedded in a technical context. It is the computer's task to in particular operate, control or monitor the system. Embedded systems are often especially adapted to a technical object to be achieved. To this end often a mixed hardware/software implementation is chosen whose parts are interconnected via a data bus for data exchange. Generally, the hardware/software implementation has to fulfil real-time requirements. For economical reasons it is of considerable advantage to simulate the real-time capability of a planned hardware/software implementation prior to its realisation. Such a simulation of an embedded system or target system usually takes place in a so-called host computer.

A mixed hardware/software implementation of an embedded system consists of one or more microprocessors executing an application program, and one or more hardware units fulfilling a hard-coded task concurrently to the microprocessors and the other hardware units. The realisation of the application program is mostly constructed on the basis of concurrent processes and mostly utilizes interrupt routines triggered by the environment or the other microprocessors or hardware units. The execution order of the concurrent processes on a microprocessor is determined by a scheduler belonging to the operation system. The scheduler selects the next process to be executed out of the set of ready-for-execute processes according to given criteria (priority, time limit, etc.). More and more often hierarchical scheduling systems are used, e.g., to separate several application programs with a time-slicing method.

The simplest possibility to simulate an embedded system is a software simulation, wherein the source code is translated into a machine code suitable for the operation of the processor of the host computer and which is then executed thereon. Environment parameters, e.g., the memory configuration, input/output by reading or writing on virtual ports and the like, of the target system can be considered.

In many cases, however, it is required that also the hardware of the target system is simulated on the host computer. To this end, the so-called Instruction Set Simulators (ISS) are nowadays conventionally used with which hardware components, e.g., processors, controllers and the like can be simulated. For this purpose, such ISS execute the machine code generated for the respective hardware component on the host computer. Thus, the functionality of a software intended for an embedded system can be examined.

Currently predominantly interpretive ISS are used for simulation. Such ISS, however, operate relatively slowly due to the required translation times and are consequently not suitable for an exact simulation of the real-time capability of an embedded system. In order to counteract this disadvantage, the prior art also provides so-called static-compiled ISS whose simulation speed is considerably higher than the interpretive ISS. However, static-compiled ISS are not particularly flexible with regard to the simulation of dynamic processes. This is disadvantageous in view of the preciseness in determining the real-time capability of an embedded system.

Moo-Kyong Chung, Chong-Min Kyung, "Improvement of Compiled Instruction Set Simulator by Increasing Flexibility and Reducing Compile Time", Proceedings of the 15th IEEE International Workshop on Rapid System Prototyping (RSP'04), 1074-6005/2004 IEEE, discloses an approach where an object format instead of a binary format is input in the simulation. A reduction of the translation times and simultaneously an improvement in flexibility can be achieved by the use of dynamic skip handlers.

WO 01/35223 A1 describes a simulation of an application program on a simulated hardware. Here the application program is at first divided into program segments and provided with tags. During simulation on the host computer, the execution time of the respective program segment can be estimated by using the tags. By adding the execution times, the overall execution time of the application program can be estimated.

Jianwen Zhu, Daniel D. Gajski, "An Ultra-Fast Instruction Set Simulator", IEEE Transactions on very large scale Integration (VLSI) Systems, Vol. 10, No. 3, June 2002, 1063-8210/2002 IEEE, discloses a method for accelerating the simulation. On the basis of a static translated Instruction Set Architecture (ISA), a special low-level code generation interface is defined instead of a conventional C-code. For the thus generated intermediate code, a RISC structure is suggested comprising a predefined, minimum instruction set but an unlimited number of virtual registers. In comparison to the dynamic-compiled ISS, the use of the suggested intermediate codes enables a portability to other host computers. Moreover, a direct manipulation of the resources of the host computer is possible.

Jwahar R. Bammi, et al., "Software Performance Estimation Strategies in a System-Level Design Tool", CODES 2000, San Diego, Calif. USA, ACM 2000 1-58113-268-9/00/05 discloses two methods for estimating the execution times in an embedded system. In both systems, the program code is provided with information about the execution time and other time-relevant information.

U.S. Pat. No. 6,230,114 B1 discloses a co-simulation design system. Model-based process simulators, which are interconnected via interfaces, simulate the communication between two simulators on a host system.

All prior art methods involve the disadvantage that a simulation of complex systems comprising in particular a plurality of cooperating processors is not possible.

It is the object of the present invention to overcome the disadvantages of the prior art. In particular, a method for simulating an embedded system is provided with which in particular the functionality and/or temporal behaviour of a complex embedded system can be simulated with improved accuracy. It is a further object of the invention that the method enables an as simple as possible mapping of the target system on the host computer.

According to a further object of the invention, the efficient simulation of a complex embedded system with hierarchical scheduling methods is possible.

This object is achieved with the features of independent claims 1, 11, 12 and 13. Suitable embodiments of the invention result from the features of the dependent claims.

According to the invention, a computer-assisted method for simulating an embedded system is suggested where a plurality of hardware components, respectively provided with a software, are connected via a data exchange network for data exchange, wherein in a simulation program every component is simulated as a processing unit managing an amount of processes, wherein with the simulation program, a start time is dynamically assigned to every processing unit, wherein the processing units are successively sorted dynamically according to their start times, wherein the processing unit with the next execution time is respectively selected via a scheduler, wherein, due to the selection of a processing unit, the respective active process is simulated by execution of a program code derived from a corresponding basic block graph and as a result of the simulation, the time required for the execution and/or information about the thus effected function is/are determined.

The suggested method enables to provide an exact prediction about the real-time capability of an embedded system, in particular a complex embedded system.

According to the present invention, a "processing unit" is a program section to which both the hardware and the software of the respective components is mapped. Every processing unit is derived from a general processing unit program structure. Such a processing unit program structure contains, e.g., tables for storing environment parameters and the like.

The term "start time" means a point of time where the processing unit is selected and activated by the first scheduler. Consequently, the active process on the processing unit is executed. The start times are dynamically assigned to the processing units via algorithms given in the simulation program. Start times may be replaced during execution of the simulation program so that the respective processing unit takes another position in the set of processing units.

According to the present invention, a "process" is for example a task, a thread, an operating system process, an interrupt service routine (ISR), which is simulated in the simulation program on a simulated processor.

A "basic block" (BB) is a part of an instruction sequence of a program, wherein a maximum sequence of subsequent instructions is comprised. A sequence is defined such that the execution of the first instruction must be followed by the necessary execution of all other instructions of the sequence.

For setting up the simulation program, the processes are presented in the form of a basic block graph. Every process may comprise one or more basic blocks.

According to the present invention, the term "simulation program" means a computer program, which is executed on a "host computer" different from the embedded system which is to be simulated.

According to a preferred embodiment, every processing unit is assigned a clock simulation program and the local time required for the execution of a process is determined using the clock simulation program. The incorporation of the suggested clock simulation program enables a particularly realistic simulation. Every processing unit is simulated in its own time-characteristic environment. Suitable clock simulation programs are known from the prior art, e.g., WO 02/21261. The execution of a process using the clock simulated for the respective processing unit supplies a "local time" or a time segment. According to an advantageous embodiment, the local times are translated into the start times by using the system time. The thus determined start times take the local time environment of the processing units into account. This further increases the accuracy of the suggested method, in particular the accuracy of the determination of the real-time capability of an embedded system simulated with the suggested method.

In a further advantageous embodiment, the structure of the hierarchical scheduler of the embedded system is mapped in the simulation program by an equivalent hierarchy of scheduler program structures, which manage the assigned program structures of the processes of the embedded system and make scheduling decisions in the same manner like the schedulers in the embedded system. Advantageously, the schedulers do not make a new decision on the basis of the process lists of the assigned processing unit in every simulation cycle, but only when changing the state of processes managed by the schedulers and/or at times defined by a TDMA scheduling.

Suitably, every process is described by at least one basic block in the basic block graph. The basic block is suitably provided with information enabling the determination of the execution time necessary for the execution of the basic block and/or the function generated by the execution of the basic block. For the generation of the simulation program, the basic block graph containing the basic blocks is subsequently translated into the program code by means of a compiler. This means that the program code contains the previously added information. Thus, the course of the simulation can be precisely reproduced for all of the processes. Consequently, it can be noticed quickly and simply whether and, if so, where an execution program to be simulated can be optimized. Advantageously, following the execution of a program code section corresponding to a basic block, it is examined according to given parameters whether the next processing unit is to be selected from the processing unit list by means of the scheduler and/or whether the active process is to be continued on the selected processing unit.

According to an advantageous embodiment, the simulation program has a first program section comprising the processing units and a second program section determining the execution times and/or the function. The first program section contains information about the embedded system to be simulated. It is to be generated anew for every embedded system to be simulated. The second program section is destined for executing and controlling the simulation program, but in particular for determining the execution times and/or functions. It need not be adapted to the respective embedded system to be simulated.

According to a particularly simple type of method, the simulation program is executed on a host computer whose processor is identical or similar to a further processor of the embedded system. In this case, a simulation model forming the basis for the simulation program can be simply generated by translating the application program to be simulated to the host computer. Naturally, the method of the invention can also be executed on host computers whose processor is different from one or more processors of the embedded system.

In the suggested method, the components of an embedded system are mapped as processing units. Thus, the suggested method can be executed considerably faster than the methods known so far, where every component is simulated by a plurality of simulation program sections. The simulation program sections are ISS and a simulation program section simulating a controller. There is a reciprocal data exchange between the simulation program sections reducing the execution speed. Such a reciprocal data exchange does not take place in the processing units according to the present invention.

Furthermore, a data processing system is suggested for simulating an embedded system where a plurality of hardware components respectively provided with software are connected via a data exchange network to exchange data, comprising a simulation program, wherein every component is simulated as a processing unit managing an amount of processes, wherein with the simulation program every processing unit is dynamically assigned a start time, a sorting unit sorting the processing units dynamically according to their start times, a scheduler for selecting the processing unit with the next start time, wherein the data processing system simulates, due to the selection of a processing unit, the active process assigned to it by executing a program code derived from a corresponding basic block graph and as a result of the simulation, the time required for execution and/or information about the effected function is determined.

Figure 2:
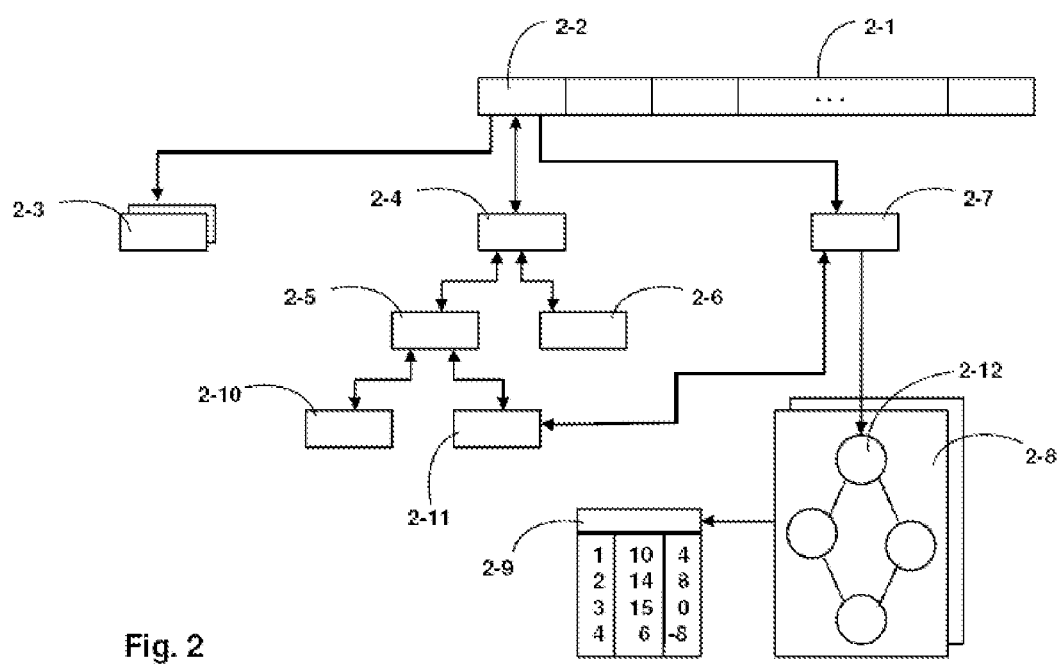
Figure 3:
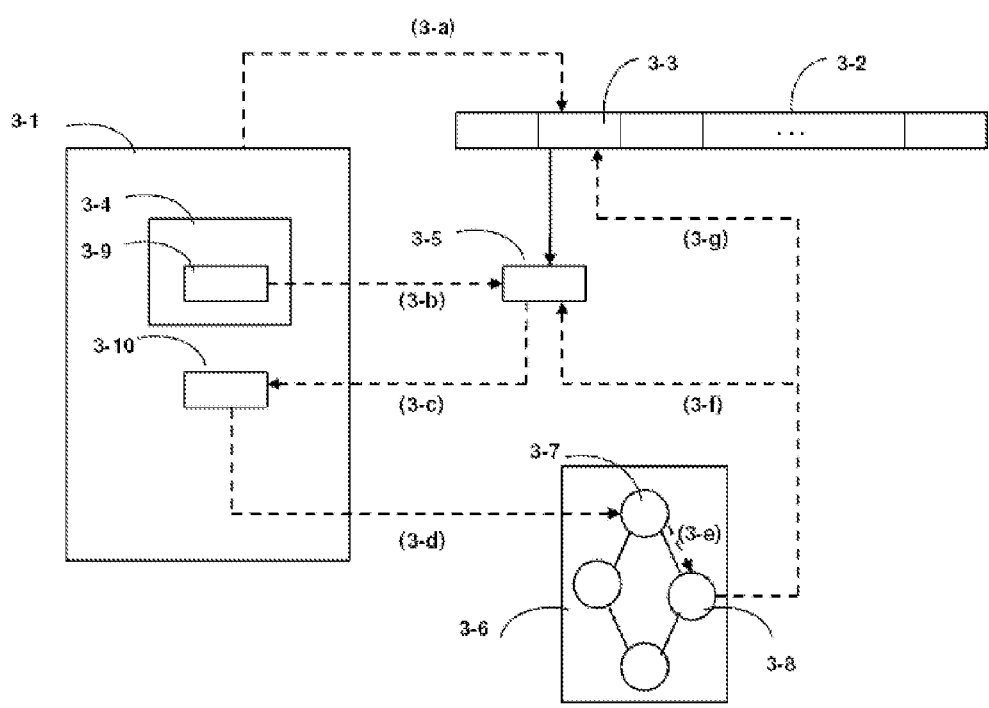
Figure 4:
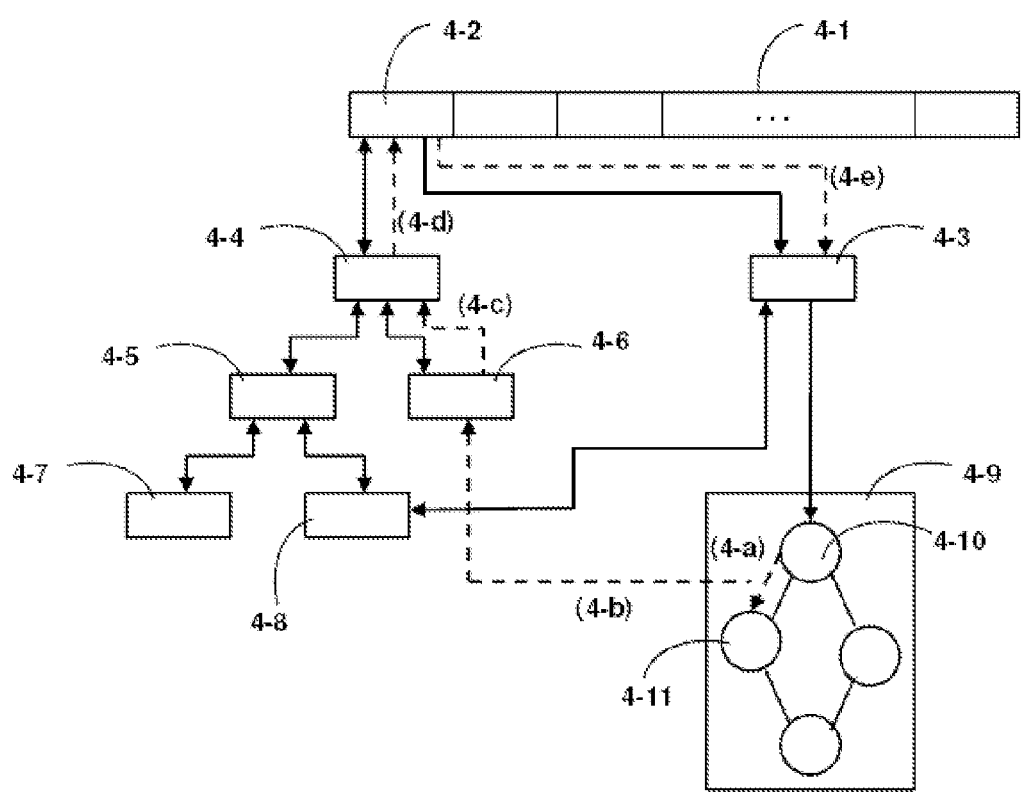

In the following an embodiment of the invention is further explained in detail with the drawings. They show:

FIG. 1 an overview of the essential generation steps of a simulation program according to the invention, FIG. 2 an overview of the architecture of a simulation program according to the invention, FIG. 3 the functioning of the method according to the invention, and FIG. 4 the course in the simulated activation of a process by the currently running process.

FIG. 1 shows the essential steps for generating a simulation program.

For generating a simulation program to simulate an embedded system on a host system 1-1, e.g., from the source listing of a given application program 1-4, the parameter files 1-5 of the processing units, the behaviour models of further hardware components 1-6 contained in the embedded system and a project file 1-2 describing the embedded system to be simulated, a first simulation program section or a simulation model 1-8 in the form of an object code is provided for the host system 1-1 (compiler 1-7) in a pre-analysis 1-3. The simulation model 1-8 is eventually bound by the binder 1-9 with a fixed simulation program section 1-10 to an executable program 1-11 and executed on the host system 1-1. The result of the running simulation 1-12 can be a report 1-13, a simulation trace 1-14 or graphic diagrams 1-15 for displaying the system behaviour. The simulation model 1-8 comprises a large amount of information, description blocks and configuration data, which are suitably built in the pre-analysis from lists or data structures of objects in the storage of the host system 1-1. The properties and capabilities of the objects can be mapped as attributes and methods of the objects.

As can be seen from FIG. 2, the simulation program comprises in particular the following elements:

A processing unit list 2-1 comprises all processing units 2-2 of the embedded system. It can be built, e.g., from the description of the target system in a project file or the parameters 2-3 of the processing units 2-2 and possibly the behaviour models of active hardware components. Further processes can be derived and supplemented from the behaviour models of the hardware components. A current process event 2-7 is determined for each of the processing units 2-2.

There is a corresponding basic block graph 2-8 for every process 2-6, 2-10, 2-11 or a plurality of or all processes of a processing unit 2-2. The basic block graph 2-8 is formed such by an analysis of the assembler code sequence that the basic blocks 2-12 are shown as vertices and the functional transitions between the basic blocks as edges. The basic block graph 2-8 divides a process in basic blocks. The time required for the execution of a basic block 2-12 is statically determinable from the vertices. The dynamic behaviour of a process can be determined by the simulation program from the edges of the basic block graph 2-8.

When establishing the basic block graph 2-8, a list 2-9 with the static proportions of the respective execution time of a process is compiled. From the analysed assembler code of the process, a functionally identical host source code, which is divided into basic blocks 2-12 is at the same time generated, which translates into an object code by using a host compiler and forms the functional part of the simulation program.

The properties 2-3 of the processing units contain data for configuration of the simulation model corresponding to the embedded system. The data relates to the hierarchical structure of the schedulers 2-4 and 2-5, the type of scheduling and the selection of the scheduling method, e.g., "first come, first serve", "priority-based" or "round robin" and the like. Furthermore, the data may contain information about simulating the memory structure and memory management.

According to a preferred embodiment, the simulation model can be generated in a way that the application program is executed as assembler code for the embedded system with a compiled Instruction Set Simulator (ISS) of the embedded system. Here variations of the embedded system in the form of a list of environment parameters can be considered in the simulation model. Further, the simulation model can be supplemented with a file with execution times for individual or all partial runs of the hardware and the application program on this hardware. From this file, the time behaviour of the embedded system can be reconstructed and calculated from the simulation. The ISS can also be replaced by a virtual ISS, which is generated on the basis of technical information from the data sheet of the embedded system, from its hardware specification or the VHDL code or similar documents. The application program can be programmed manually as host source code for the simulation model on the basis of information from the data sheet of the embedded system, the hardware specification or the VHDL code or similar documents.

According to a further variant, the application program can also be executed on a plurality of embedded systems. In this case the simulation model can be generated in a way that by means of a complex pre-processing program, various application program modules are executed on the compiled ISS corresponding to the respective embedded system. Variations of the target systems as well as the communication systems connecting them can be considered in the simulation model by a list of environment parameters.

FIG. 3 shows method steps of a simulation cycle. A scheduler 3-4 running in the simulation core 3-1 selects from a list 3-2 with processing units sorted according to their start times said processing unit 3-3 with the next start time (step 3-*a*). Subsequently, the active process of the selected processing unit is executed which is referenced in the process result 3-5 (3-*b*)(3-*c*).

For execution of the active process 3-10, a program code section of the corresponding basic block 3-7 is executed in the basic block graph 3-6 (3-*d*)(3-*e*). Following the execution of a basic block, the next basic block in the process event 3-5 is updated (3-*f*). Subsequently it is tested whether a renewed scheduling process is necessary in view of the then changed system state and time progress. A renewed scheduling process is only necessary on the processing unit 3-3 when the execution of the basic block graph 3-6 terminated or deactivated the currently simulated process or activated or deactivated another process on the same or another processing unit 3-3. In this case the start time of the respective processing unit is updated (3-*g*). Afterwards the simulation cycle starts anew.

FIG. 4 explains the method steps in more detail, which take place when the currently simulated process activates another process. The processing units 4-2 stored in the list 4-1 refer besides the process event 4-3 also to a hierarchical structure of schedulers. In the shown example it consists of a scheduler 4-4 managing a subordinate scheduler 4-5 and a process 4-6. The scheduler 4-5 itself manages process 4-7 and process 4-8. The simulation core now executes the vertices 4-10 referenced by the process event 4-3 in the basic block graph 4-9 of the process 4-8 (step 4-a). The application program executed in a simulated manner activates process 4-6 in this simulation step. This activation is passed to process 4-6 (4-b), which in turn informs the scheduler 4-4 (4-c). Scheduler 4-4 then tests whether process 4-8 active so far or its superordinate scheduler 4-5 has to be preempted by the activation. If this is the case the processing unit 4-2 is informed (4-d), which then updates the process event 4-3 with the new process 4-6 (4-e). If, however, scheduler 4-4 decides that no process preemption has to take place, the processing unit 4-2 is not informed and process event 4-3 remains unchanged, which means that the old active process 4-8 is continued.

In the simulation program the simulation of the interaction between software and hardware of each component of the real system takes place by simulated access to the registers of the hardware as it is also the case in the target system. Such accesses change the internal state of the hardware in the target system. In the simulation program such changes in the state of a hardware can be simulated by activation of a corresponding process. The further functional and temporal behaviour of the simulated hardware can then be executed independent of the temporal and functional behaviour of the simulated software.

In the target system the interaction of several hardware components takes place by the exchange of electric signals. In the simulation program the electric gauges are abstracted and mapped in the form of complex data packages to increase the simulation speed.

Although the invention is explained and described in detail with the Figures and the corresponding description, this depiction and detailed description are illustrative and exemplary and do not restrict the invention. Naturally, skilled persons may perform changes and alterations without going beyond the scope of the following claims. In particular the invention also comprises embodiments with any combination of features, which are mentioned or shown above with respect to various aspects and/or embodiments.

The invention also comprises individual features in the Figures even if they are shown in connection with other features and/or are not mentioned above.

Furthermore, the term "comprise" and derivations thereof do not exclude other elements or steps. Additionally, the indefinite article "a(n)" and derivations thereof do not exclude a plurality. The functions of several of the features mentioned in the claims can be fulfilled by a unit. The terms "basically", "about", "approximately" and the like in connection with a characteristic or a value define in particular also exactly the characteristic or the value. All reference signs in the claims are not to be understood as restricting the scope of the claims.

LIST OF REFERENCE SIGNS FIG. 1

1-1 host system
1-2 project file
1-3 pre-analysis
1-4 application program
1-5 processor model library
1-6 HW component library
1-7 compiler
1-8 object code of the first simulation program section
1-9 binder
1-10 library of the simulator core
1-11 executable simulation code
1-12 running simulation
1-13 result report
1-14 simulation trace
1-15 diagrams with depictions of the dynamic behaviour of the embedded system

LIST OF REFERENCE SIGNS FIG. 2

2-1 processing unit list
2-2 processing unit
2-3 properties of the processing units
2-4 superordinate scheduler
2-5 subordinate scheduler
2-6 process
2-7 process event
2-8 basic block graph
2-9 tables with static execution times of the basic block vertices
2-10, 2-11 process
2-12 basic block

LIST OF REFERENCE SIGNS FIG. 3

3-1 simulation core
3-2 processing unit list
3-3 processing unit
3-4 scheduler
3-5 process event
3-6 basic block graph
3-7, 3-8 basic block
3-9 selected processing unit
3-10 selected process
(3-a) . . . (3-g) method steps

LIST OF REFERENCE SIGNS FIG. 4

4-1 processing unit list
4-2 processing unit
4-3 process event
4-4, 4-5 scheduler
4-6, 4-7, 4-8 process
4-9 basic block graph
4-10, 4-11 basic block
(4-a) . . . (4-e) method steps

The invention claimed is:

1. Computer-assisted method for simulating an embedded system, wherein a plurality of hardware components, respectively provided with a software, are connected via a data exchange network for data exchange, the method comprising:
    simulating components of the embedded system as a processing unit managing an amount of processes,
    dynamically assigning, with the simulation program, a start time to every processing unit, the start time being a point of time where the processing unit is selected and activated,
    successively sorting the processing units dynamically according to their start times,
    selecting a processing unit with the next start time via a scheduler,
    wherein, due to the selection of a processing unit, the respective active process is simulated by execution of a program code derived from a corresponding basic block graph and as a result of the simulation, a time required for the execution and/or information about a function effected by the simulation is/are determined.

2. The method according to claim 1, wherein every processing unit is assigned a clock simulation program and a local time required for the execution of a process is determined using the clock simulation program.

3. The method according to claim 2, wherein the local times are translated to the start times by using the system time.

4. The method according to claim 1, wherein every process is described by at least one basic block in the basic block graph.

5. The method according to claim 1, wherein the basic block is provided with information enabling the determination of the execution time necessary for the execution of the basic block and/or a function generated by the execution of the basic block.

6. The method according to claim 1, wherein the basic block graph containing the basic blocks is translated by means of a compiler to the program code.

7. The method according to claim 1, wherein the simulated embedded system uses one or more hierarchical schedulers.

8. The method according to claim 1, wherein following the execution of a program code section corresponding to a basic block, it is examined according to given parameters whether the next processing unit is to be selected by means of the scheduler and/or whether the active process is to be continued on the selected processing unit.

9. The method according to claim 1, wherein the simulation program has a first simulation program section comprising the processing units and a second simulation program section determining the execution time and/or the function.

10. The method according to claim 1, wherein the simulation program is executed on a host computer whose processor is identical or similar to a further processor of the embedded system.

11. Computer program product having instructions stored on a non-transitory computer-readable data carrier executable by a computer, wherein the computer performs the computer-executable instructions when the program product is executed on the computer to perform a method comprising:
   simulating components of the embedded system as a processing unit managing an amount of processes,
   dynamically assigning, with the simulation program, a start time to every processing unit, the start time being a point of time where the processing unit is selected and activated,
   successively sorting the processing units dynamically according to their start times,
   selecting a processing unit with the next start time via a scheduler,
   wherein, due to the selection of a processing unit, the respective active process is simulated by execution of a program code derived from a corresponding basic block graph and as a result of the simulation, a time required for the execution and/or information about a function effected by the simulation is/are determined.

12. Data processing system for simulating an embedded system, wherein a plurality of hardware components, respectively provided with a software, are connected via a data exchange network for data exchange, the data processing system comprising:
   a simulation program host computer that simulates every component as a processing unit managing an amount of processes,
   wherein the simulation program host computer dynamically assigns a start time to every processing unit, the start time being a point of time where the processing unit is selected and activated,
   a sorting unit configured for sorting the processing units dynamically according to their start times,
   a scheduler configured for selecting the processing unit with the next start time,
   wherein the data processing system simulates, due to the selection of a processing unit, the active process assigned to the processing unit by executing a program code derived from a corresponding basic block graph and as a result of the simulation, a time required for execution and/or an information about the function effected by the simulation is determined.

13. The data processing system according to claim 12, wherein every processing unit is assigned a clock simulation program and a local time required for the execution of a process is determined using the clock simulation program.

14. The data processing system according to claim 13, wherein the data processing system is adapted to translate the local times to the start times using the system time.

15. The data processing system according to claim 12, wherein every process is described by at least one basic block in the basic block graph.

16. The data processing system according to claim 12, wherein the basic block is provided with information enabling the determination of the execution time necessary for an execution of the basic block and/or the function generated by the execution of the basic block.

17. The data processing system according to claim 12, wherein the data processing system is adapted to translate the basic block graphs containing the basic blocks to the program code by means of a compiler.

18. The data processing system according to claim 12, wherein the simulated embedded system uses one or more hierarchical schedulers.

19. The data processing system according to claim 12, wherein the data processing system is adapted to examine, following the execution of a program code section corresponding to a basic block, according to given parameters whether the next processing unit is to be selected by means of the scheduler and/or whether the active process is to be continued on the selected processing unit.

20. The data processing system according to claim 12, wherein the simulation program has a first simulation program section comprising the processing units and a second simulation program section determining the execution time and/or the function.

21. The data processing system according to claim 12, wherein the simulation program is carried out on a host computer whose processor is identical or similar to a further processor of the embedded system.

\* \* \* \* \*